May 4, 1965 R. R. HABERECHT ETAL 3,181,229
HERMETICALLY SEALED SEMICONDUCTOR DEVICE
AND METHOD FOR PRODUCING IT
Filed Jan. 8, 1962
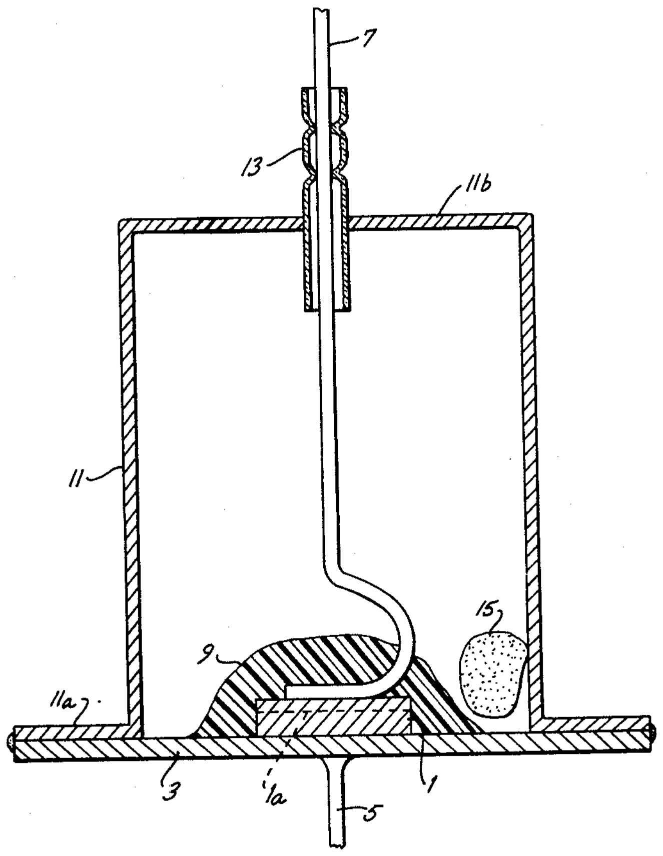
INVENTORS
JAMES M. BOOE
ROLF R. HABERECHT
WALLACE D. LOFTUS
BY
ATTORNEY United States Patent Office 3,181,229
Patented May 4, 1965

1 2

3,181,229

HERMETICALLY SEALED SEMICONDUCTOR DEVICE AND METHOD FOR PRODUCING IT

Rolf R. Haberecht, James M. Booe, and Wallace D. Loftus, Indianapolis, Ind., assignors to P. R. Mallory & Co., Inc., Indianapolis, Ind., a corporation of Delaware Filed Jan. 8, 1962, Ser. No. 164,655
5 Claims. (Cl. 29—155.5)

This invention pertains to semiconductive devices, and particularly to a hermetically sealed semiconductive device and a method for producing it such that the electrical characteristics of the device are stabilized against deterioration during prolonged storage at temperatures below the normal operatng temperature range.

Prepared wafers of semiconductive materials, such as germanium or silicon, exhibit extreme sensitivity to contact with even traces of water vapor. It is, therefore, substantially universal practice to hermetically encapsulate the active wafer element of such semiconductive devices or transistors and diodes within a metal container from which substantially all water vapor has been removed prior to sealing. In addition, in order to protect the wafer during the interval after final etching and cleaning and prior to encapsulation, it is usually provided with an adherent coating of a substantially water-impervious resin, such as silicone varnish.

Despite these protective measures, hermetically sealed semiconductive devices containing resin-coated wafers exhibit severe degradation of their electrical characteristics after reasonable periods of storage at normal room temperatures. As a typical example, a silicon junction diode which had a reverse breakdown voltage of over 1000 volts immediately after encapsulation, was found to have a reverse breakdown voltage of only 350 volts after being stored for 24 hours at about 25° C. Investigation of this phenomenon by applicants indicates that this behavior is due to the continued polymerization of the resin coating subsequent to encapsulation of the wafer. This results in liberation of water from the molecules of resin, and in the formation of channels through which the resultant water vapor can penetrate to the surface of the semiconductive wafer.

Accordingly, an object of present invention is to provide a hermetically sealed semiconductive device which is stabilized against degradation of its electrical characteristics during prolonged storage at temperatures below the normal operating temperature range.

A further object is to provide a hermetically sealed semiconductive device wherein a water vapor pressure gradient is maintained in a direction away from the surface of the semiconductive wafer contained therein.

A further object is to provide a method for producing a hermetically sealed semiconductive device which is stabilized against degradation of its electrical characteristics even after prolonged storage at temperatures below the normal operating temperature range.

A semiconductive device in accordance with the invention comprises a wafer of semiconductive material contained in a hermetically sealed capsule, at least a portion of the surface of the wafer being covered with a polymerized water-impervious resin which adheres thereto. The complete device further comprises a barium oxide desiccant contained within the capsule and adapted to maintain a water vapor pressure gradient therein in a direction away from the covered surface of the wafer. In consequence, any water evolved by the resin is precluded from penetrating to the covered surface of the wafer.

Further in accordance with the invention, a process for producing such a stabilized semiconductive device comprises coating at least a portion of the surface of the semiconductive wafer with a water-impervious resin which adheres thereto. The coated wafer is then heated to cure the resin and cause it to polymerize, following which it is placed within a container together with a quantity of barium oxide desiccant. The container is subsequently heated to a temperature of 100° C.–200° C., and then hermetically sealed while still at a temperature within that range. The final step of the process is to heat the sealed container to a temperature of at least 120° C. for a period of at least 18 hours.

A more detailed description of the invention is presented in the following specification with reference to the accompanying drawing, but it should be noted that the true scope of the invention is actually pointed out in the ensuing claims.

In the drawing is shown, partially in section, a hermetically sealed semiconductive device constructed in accordance with the invention. The device has been illustrated as a diode comprising a prepared wafer 1 of semiconductive material, such as germanium, silicon, or gallium arsenide, or other compound semiconductor. Wafer 1 will previously have had formed therein by alloying, diffusion, or other techniques common in the art, a transverse PN junction *1a* which extends to the longitudinal surface thereof. The wafer is supported on a conductive metal base 3 soldered to one of its faces in low resistance ohmic contact. A conductive terminal lead 5 is affixed to the underside of base 3 to permit electrical connection thereto. The other face of wafer 1 is soldered to a second conductive terminal lead 7 which is curved so as to extend in the longitudinal direction shortly past the juncture with the wafer.

Coated over the exposed surface of wafer 1 and adhering thereto is a polymerized water-impervious resin 9. As stated above, resin 9 may be a commercial grade of silicone varnish such as Dow Corning 997 varnish which has been cured by heating after being applied to the wafer. The curing operation causes the varnish to polymerize into a tough and substantially water-impervious mass by liberation of solvents and water and formation of Si-O-Si molecular linkages. However, inasmuch as this is an organic homopolar (not ionic) reaction, it is understandable that polymerization is not completed at specified times and temperatures. Thus, even though the usual curing procedure for silicone varnish is to heat in air at about 100° C. for approximately 1 hour, followed by heating under partial vacuum at about 200° C. for approximately 2 hours, it must be recognized that the resultant cured resin will continue to polymerize for an appreciable time thereafter. If it is contained in a sealed enclosure, the resin will therefore exhibit at any time and temperature a definite equilibrium vapor pressure of water. This behavior was experimentally verified by baking a silicone varnish coated silicon PN junction diode in a vacuum oven at about 200° C. for 24 hours, after which the vacuum pump was turned off.

The reverse leakage current of the diode was continually measured, using about 200 volts applied across the terminals thereof in the reverse direction. During the first 2 hours the leakage current dropped to a level of about 1 milliampere. It then remained stable at that level during the remaining 22 hours of vacuum bake. Although this would appear to be more than adequate to effect complete polymerization, on turning off the vacuum pump, the leakage current began increasing at a substantial rate. In one case, the rate of increase was 4 milliamperes per hour. About 15 hours later the vacuum pump was turned on again, and the leakage current rapidly dropped back to reach the normal level of about 1 milliampere after about 2 hours. A possible explanation for this behavior is that the water liberated by polymerization of the varnish leaves channels therein through which the resultant water vapor can re-enter and penetrate to the underlying surface of the silicon wafer. Alternatively, the vapor may be absorbed by the varnish.

Applicants' approach to preventing the foregoing contamination of the protected wafer surface by water vapor liberated from the resin coating is to establish and maintain a favorable vapor pressure gradient in a direction away from the wafer surface. Referring again to the drawing, wafer 1 is contained in a hermetically sealed metal capsule 11 having a flanged lower edge 11*a* welded to the adjacent surface of supporting base 3. The roof portion 11*b* of the capsule contains a central aperture supporting a short length of glass tubing 13 through which lead 7 extends. Tubing 13 is sealed to lead 7, creating a hermetically sealed enclosure for wafer 1, after evacuation of all water vapor from the capsule.

The favorable pressure gradient which is required is made possible by providing a quantity of barium oxide desiccant within capsule 11. In the drawing this has been shown as a porous pellet 15 of barium oxide. However, it is equally feasible to provide it in the form of a powder intermixed with the silicone varnish prior to curing. The selection of barium oxide as the desiccant employed is due to the fact that it is the most efficient known dehydrating agent for drying gases. Of course, it should be thoroughly dried prior to placing it within capsule 11. If used in the form of a porous pellet, it may simply be placed on the surface of varnish 9 prior to bringing capsule 11 into place, or it may be already included with the capsule.

It should be noted that in some instances only the junction portion of the enclosed semiconductive wafer is coated with protective resin, inasmuch as this is the region most sensitive to contact with water vapor. In operation, the rate at which the barium oxide is capable of absorbing water vapor must exceed the rate at which it is liberated by the polymerizing silicone varnish in order to maintain the requisite vapor pressure gradient away from the protected surface of wafer 1. This condition will not be obtained merely by placing a quantity of barium oxide within the capsule and sealing after having cured the varnish by heating in usual fashion for a few hours. As applicants have determined, it is necessary to heat the newly sealed capsule with the barium oxide therein for a period of at least about 18 hours at a temperature of at least 120° C. It is believed that under these conditions the polymerization proceeds to a sufficient degree, with absorption of the liberated water vapor by the barium oxide, so that, after the capsule returns to room temperature, the rate of continued liberation of water is exceeded by the absorption capability of the barium oxide. It is also possible that during the extended heating in the presence of barium oxide the channels in the varnish are enabled to close up because of the favorable pressure gradient which exists. In any case, however, the favorable pressure gradient in a direction away from the surface of wafer 1 is then returned after the capsule cools down to room temperature. The subsequent heating of the sealed capsule, as described, is therefore necessary to adapting the barium oxide to maintain that pressure gradient.

Although the essential features of a process for producing a stabilized semiconductor device in accordance with the invention have been indicated above, certain important details thereof bear some further elaboration. Curing of the resin subsequent to coating wafer 1 may be effected by heating the coated wafer to a temperature of 100° C.–200° C. for a period of 1–3½ hours. The preferred curing operation is first to allow the wafer to dry in air at room temperature for about 1 hour, then to bake it in air at a temperature of 100° C. for another hour, and finally to bake it under vacuum at 200° C. for about 2½ hours.

After having placed the cured resin-coated wafer 1 and the barium oxide desiccant 15 within capsule 11, prior to hermetic sealing thereof it is preferable to heat the capsule to a temperature of 100° C.–200° C. More specifically, it may be heated to a temperature of about 200° C., under vacuum, for about ½ hour. The capsule is then hermetically sealed while still at approximately that temperature, following which it is heated to a temperature of at least 120° C. for a period of at least 18 hours. In particular, a temperature of 150° C. for 18–25 hours has been found highly satisfactory.

Hermetically sealed silicon diodes made as described have been found to maintain excellent electrical characteristics, both as to leakage current and reverse breakdown voltage, even after storage for 8 months at room temperature (250° C.). The same was true after storage at elevated temperatures of about 175° C., and after operation for about 1 month at 150° C.

Although the invention has been described with reference to specific embodiments thereof, it will be apparent to those skilled in the art that it is amenable to many modifications and extensions which may be made without departing from the true spirit and scope of the invention as defined in the ensuing claims.

What is claimed is:

1. A process for producing a stabilized semiconductor device containing a wafer of semiconductive material, said process comprising the steps of: coating at least a portion of the surface of said wafer with a water-impervious resin which adheres thereto; heating the coated wafer to cure said resin and effect polymerization thereof; placing the cured resin-coated wafer and a quantity of barium oxide desiccant within a container, and heating said container to a temperature of 100°–200° C.; hermetically sealing said container while still at a temperature within said range; and heating the sealed container to a temperature of at least 120° C. for a period of at least 18 hours.

2. The process of claim 1, wherein said container is maintained at said temperature of 100° C.–200° C. for at least ½ hour prior to hermetic sealing thereof.

3. The process of claim 1, wherein the curing of said resin is effected by heating said coated wafer to a temperature of 100° C.–200° C. for a period of 1–3½ hours.

4. The process of claim 1, wherein said desiccant is placed in said container in the form of a porous pellet.

5. A process for producing a stabilized semiconductor device containing a wafer of semiconductive material, said process comprising the steps of: coating at least a portion of the surface of said wafer with a mixture of a water-impervious resin and a powdered barium oxide desiccant, said mixture being adherent to said surface; heating the coated wafer to a temperature of 100° C.–200° C. for a period of 1 to 4 hours, thereby curing said resin and effecting polymerization thereof during said period; hermetically sealing in a container at the end of said period; and heating the sealed container to a temperature of at least 120° C. for a period of at least 18 hours.

(References on following page)

References Cited by the Examiner

UNITED STATES PATENTS

| | | | |
|---|---|---|---|
| 2,664,528 | 12/53 | Stelmak | 317—235 |
| 2,720,617 | 10/55 | Sardalla | 317—235 |
| 2,725,312 | 11/55 | Schell | 317—234 |
| 2,744,218 | 5/56 | Burton et al. | 317—234 |
| 2,877,392 | 3/59 | Koetz et al. | 317—234 |
| 2,877,629 | 5/59 | Nijland et al. | 317—234 |
| 2,888,736 | 6/59 | Sardela | 317—235 |
| 2,906,931 | 9/59 | Armstrong | 317—235 |
| 2,928,030 | 3/60 | Lighty | 317—234 |
| 2,998,556 | 8/61 | Pritchard et al. | 317—234 |
| 2,998,557 | 8/61 | Van Amstel | 317—234 |
| 3,002,133 | 9/61 | Maiden et al | 317—234 |
| 3,007,089 | 10/61 | King | 317—234 |
| 3,081,374 | 3/63 | Burch | 317—234 |
| 3,083,320 | 3/63 | Godfrey et al. | 317—234 |

OTHER REFERENCES

Reinhold Plastics Applications Series; Silicones by Meals and Lewis, page 64, copyright 1959 by Reinhold Publishing Co.

DAVID J. GALVIN, *Primary Examiner.*

JAMES D. KALLAM, *Examiner.*